United States Patent
Yu et al.

(10) Patent No.: US 8,369,180 B2
(45) Date of Patent: Feb. 5, 2013

(54) MEMORY WORD LINE BOOST USING THIN DIELECTRIC CAPACITOR

(75) Inventors: Hung-Chang Yu, Hsinchu (TW); Yue-Der Chih, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 161 days.

(21) Appl. No.: 12/949,261

(22) Filed: Nov. 18, 2010

(65) Prior Publication Data

US 2012/0127806 A1    May 24, 2012

(51) Int. Cl.
  *G11C 8/00* (2006.01)
(52) U.S. Cl. ............... 365/230.06; 365/189.09
(58) Field of Classification Search ............ 365/230.06, 365/189.09, 149
See application file for complete search history.

(56) References Cited

U.S. PATENT DOCUMENTS

| | | | | |
|---|---|---|---|---|
| 5,504,715 | A | * | 4/1996 | Lee et al. ................. 365/230.06 |
| 6,373,753 | B1 | * | 4/2002 | Proebsting ............... 365/189.09 |
| 2007/0109906 | A1 | * | 5/2007 | Leung ...................... 365/230.06 |
| 2010/0039170 | A1 | * | 2/2010 | Ryoo ........................... 327/538 |

* cited by examiner

*Primary Examiner* — Vu Le
(74) *Attorney, Agent, or Firm* — Lowe Hauptman Ham & Berner, LLP

(57) ABSTRACT

A memory includes a word line and a word line boost circuit. The word line boost circuit includes a capacitor having a capacitor dielectric thickness, and a transmission gate coupled to the word line and the capacitor. The transmission gate has a gate-dielectric thickness that is greater than the capacitor dielectric thickness. The word line boost circuit is configured to supply a high voltage that is higher than a power supply voltage to the word line during an operation of the memory by utilizing the capacitor.

20 Claims, 4 Drawing Sheets

MEMORY WORD LINE BOOST USING THIN DIELECTRIC CAPACITOR

TECHNICAL FIELD

The present disclosure relates generally to an integrated circuit, and more particularly to a memory word line boost circuit.

BACKGROUND

In a memory, e.g., a flash memory, sometimes a word line's voltage needs to be higher than a power supply voltage VDD in order to effectively fulfill certain functions, e.g., read, erase, and/or program (write) functions. In some architectures, a thick gate-dielectric Metal-Oxide-Semiconductor (MOS) device is used as a high voltage device in a word line boost circuit to boost the word line voltage higher than VDD supply. For example, a thick oxide MOS device is used because during an erase operation, the MOS device is exposed to a high voltage stress (e.g., more than 13 V in a flash memory cell).

However, due to a relatively smaller gate capacitance in the high voltage device, a large number of high voltage devices are required to pump sufficient charge carriers into the word line's voltage supply and in turn to boost the word line voltage to a level higher than VDD in a reasonable time period. But a large number of high voltage devices consume a large chip area.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
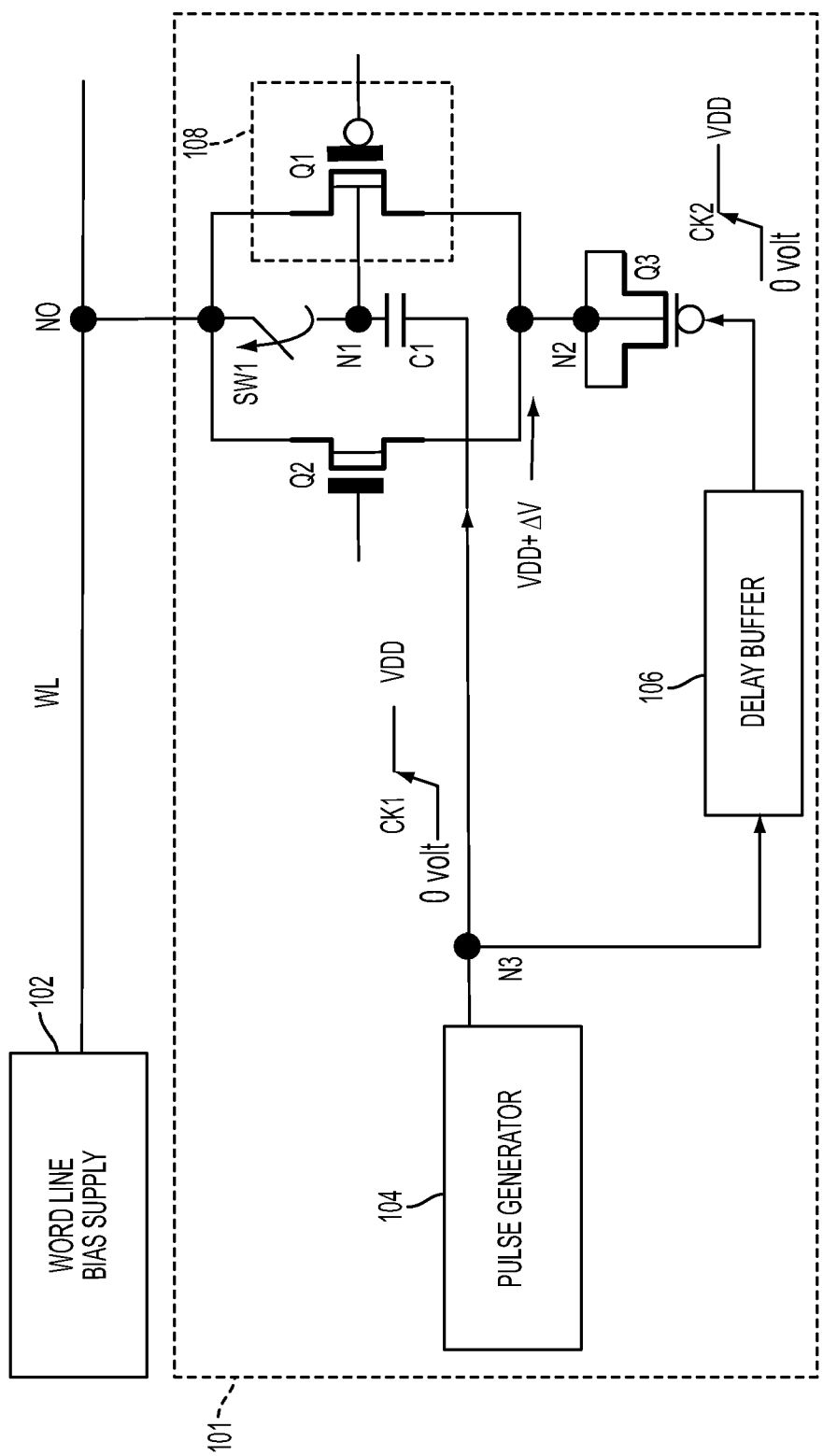
FIG. 1 is a schematic diagram showing an exemplary word line boost circuit for a memory using a thin dielectric capacitor in a read operation according to some embodiments.

FIG. 1 is a schematic diagram showing an exemplary word line boost circuit for a memory, e.g., a flash memory, using a thin dielectric capacitor in a read operation according to some embodiments. A dielectric (layer) can be implemented using various materials, e.g., oxide. The word line boost circuit 101 is coupled to a word line (WL) at a node N0. The WL is coupled to a word line bias supply 102.

The word line boost circuit 101 includes a pulse-generator 104, a delay buffer 106, a switch SW1, a transmission gate comprising high-voltage devices Q1 and Q2 (having thick gate-dielectric), a core device Q3 (having thin gate-dielectric) that is a (MOS) capacitor (for word line boost), and a capacitor C1 having thick gate-dielectric. Here, the term "gate-dielectric" is used for a dielectric layer of a MOS capacitor, but other terms can be used for an equivalent dielectric layer structure between two conductors of a capacitor for other embodiments, e.g., a "capacitor dielectric (layer)". The capacitor C1 is used to boost (i.e., supply a higher voltage than a power supply voltage VDD to) the N-well 108, and is significantly smaller than the core device capacitor Q3 that is used to boost the WL to a higher voltage than VDD.

The thickness of thick and thin gate-dielectric is relative and can be varied depending on the integrated circuit technology implemented. For example, in one implementation of a 0.18 μm technology, the thick gate-dielectric thickness can be about 200 Å, while the thin gate-dielectric thickness can be about 30 Å. Thick gate-dielectric devices are suitable for a high-voltage (e.g., higher than VDD) operation, while thin gate-dielectric devices would be adversely influenced by the stress and eventually may fail under the high-voltage operation. For a read operation, the word line bias supply 102 provides a power supply voltage VDD to WL and at node N0, and the VDD is also supplied to N1 through the switch SW1 that is closed before being opened. Then SW1 is opened and the transmission gate (devices Q1 and Q2) are fully turned on. The capacitor C1 keeps the voltage level of node N1 at VDD, and the transmission gate (devices Q1 and Q2) supplies the VDD at the node N2 that charges the capacitor Q3.

Then the pulse generator 104 applies a pulse signal CK1 to node N3, which is coupled to the capacitor C1 and pushes (boosts) the voltage at N1 from VDD to VDD plus ΔV (i.e., VDDb=VDD+ΔV), e.g., VDD=1.8 V and VDDb=2.8 V. Also, the pulse signal from the pulse generator 104 passes through the delay buffer 106 having a time delay Δt, and provides a pulse signal CK2 to the MOS capacitor Q3. The pulse signal CK2 also pushes (boosts) the voltage level of node N2 from VDD to VDD plus ΔV (i.e., VDDb=VDD+ΔV).

The node N1 is coupled to a bulk of the Q1 device (PMOS transistor), which is contained in a (high-voltage) N-well 108. Because the voltage level of the node N1 is boosted by the pulse signal CK1 from VDD to VDDb before the voltage level of the node N2 (coupled to a source of the Q1 device) is boosted by the pulse signal CK2 from VDD to VDDb, a junction leakage current that may result from a forward-bias across a p-n junction in the N-well 108 is prevented.

Since gate-dielectric thickness of core device Q3 (e.g., a MOS capacitor) is smaller than the thickness of a high-voltage device having a thick gate-dielectric used in similar circuits, the gate capacitance of the core device Q3 is greater than that of a high-voltage device. The relationship between charge carrier Q and the capacitance C of a capacitor can be expressed as Q=CV, where V is the voltage across the capacitor. Hence the larger the capacitance, the more charge carriers (or current) can be provided, e.g., for the load coupled to WL.

In one example, compared to a high-voltage device having Width/Length W/L=600 μm/1.6 μm, a thin gate-dielectric device has W/L=150 μm/1.6 μm for similar capacitance. Therefore, the area of the thin gate-dielectric device (core device) is only 25% of the high-voltage (thick gate-dielectric) device.

Figure 2:
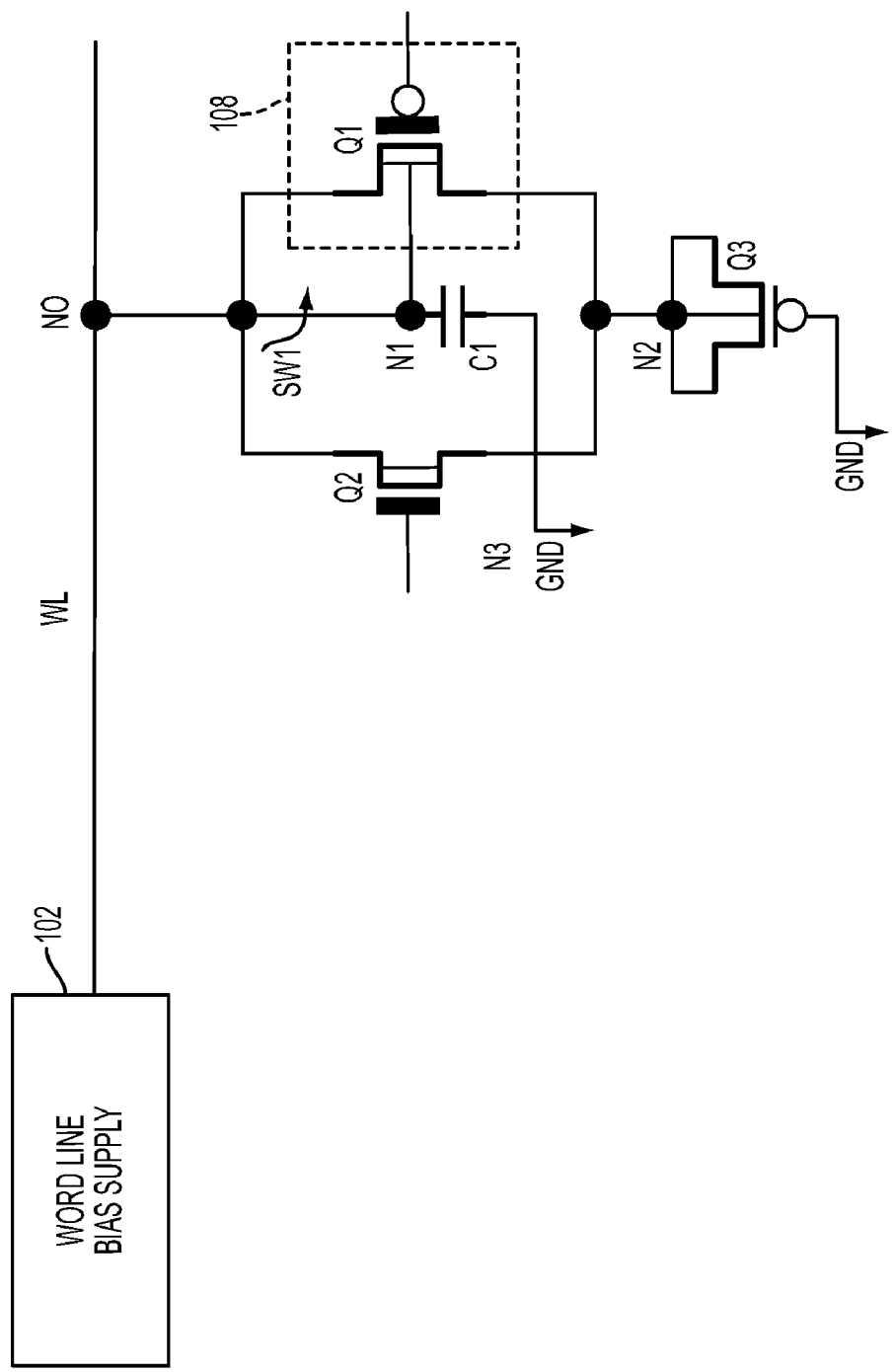
FIG. 2 is a schematic diagram showing the exemplary word line boost circuit for a memory in FIG. 1 in an erase (or program) operation according to some embodiments.

FIG. 2 is a schematic diagram showing the exemplary word line boost circuit for a memory in FIG. 1 in an erase (or program) operation according to some embodiments. During the erase (ultra-high voltage) operation, a much higher voltage (e.g. 13 V or above) than a power supply voltage VDD (e.g., 1.8 V) can be supplied from the word line bias supply. For the erase operation, the pulse generator 104 in FIG. 1 is disabled. Hence, no pulse signals (CK1 and CK2) are provided, and one terminal of the capacitor C1 and the gate of the thin gate-dielectric device Q3 (i.e., MOS capacitor) are grounded.

Meanwhile, the switch SW1 is closed to connect the N-well 108 to the source terminal of Q1 in order to prevent a junction leakage current across the p-n junction of Q1 formed by the source and the bulk of Q1. The devices Q1 and Q2 (transmission gate) are turned off during the erase (high-voltage) operation. Thus, the thin gate-dielectric device Q3 is isolated from the high-voltage stress (from the word line bias supply 102) during the ultra-high voltage operation.

Figure 3:
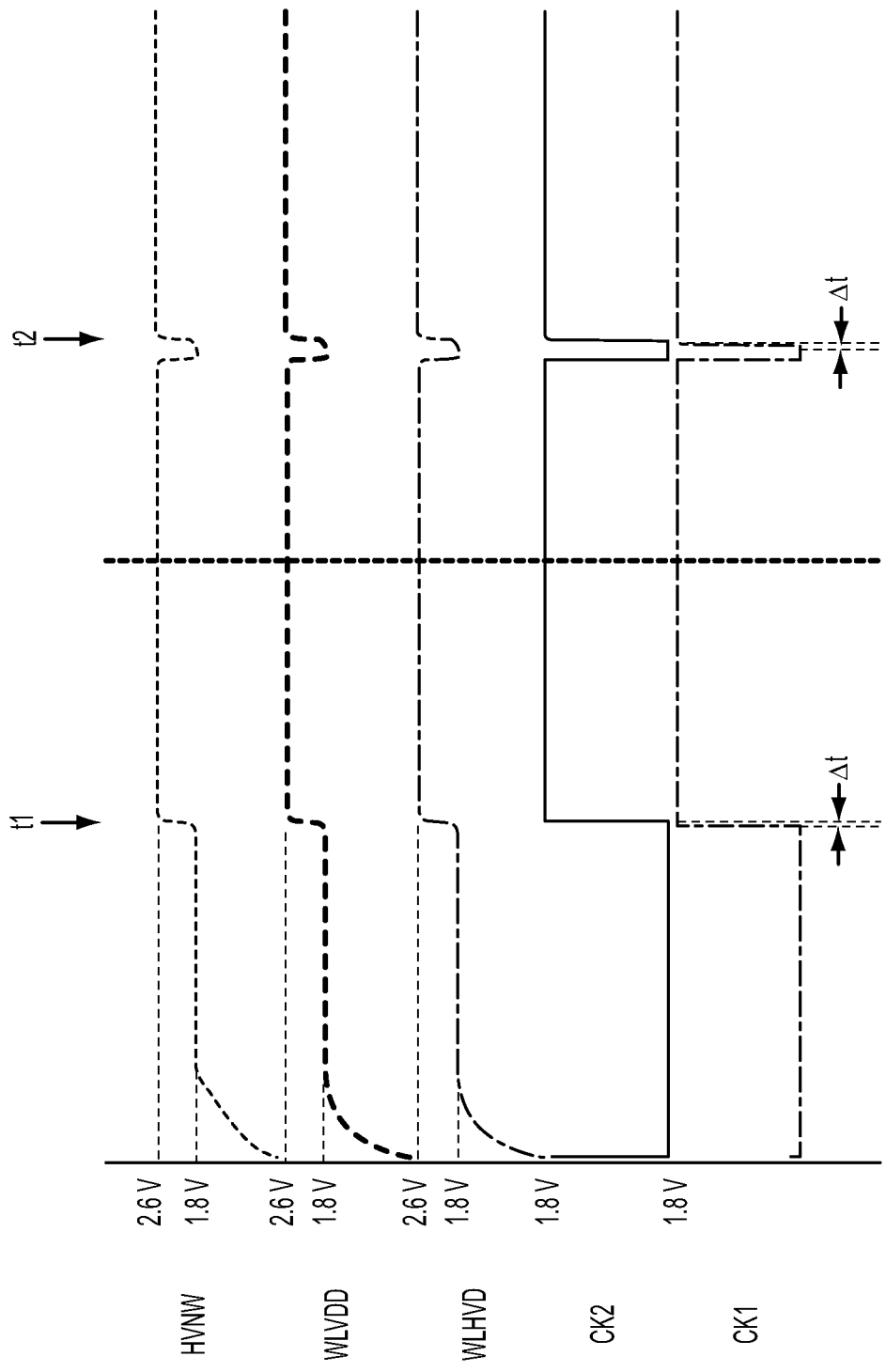
FIG. 3 is a plot showing waveforms for the exemplary word line boost circuit for a memory in FIG. 1 according to some embodiments.

FIG. 3 is a plot showing waveforms for the exemplary word line boost circuit for a memory in FIG. 1 according to some embodiments. The voltage waveforms of (high-voltage) N-Well 108 (HVNW) and word line (WLVDD) show that they are successfully boosted to about 2.6 V (VDD=1.8 V) at about time t1 (and t2), while waveforms CK1 and CK2 show that CK2 is asserted Δt (from the delay buffer 106) after CK1. Compared to the word line waveform (WLHVD) of a word line boost circuit having a thick gate-dielectric MOS capacitor instead of the thin gate-dielectric MOS capacitor (Q3), WLVDD show similar a boost function.

However, compared to the word line boost circuit using a thick gate-dielectric MOS capacitor, the exemplary word line boost circuit 101 using a thin gate-dielectric MOS capacitor has a significantly reduced area (e.g., 25%). Also, the ultra high voltage (e.g., 13 V or above) that may be used during some operations, e.g., an erase or program operation, does not damage the thin gate-dielectric MOS capacitor in the exemplary word line boost circuit 101.

Figure 4:
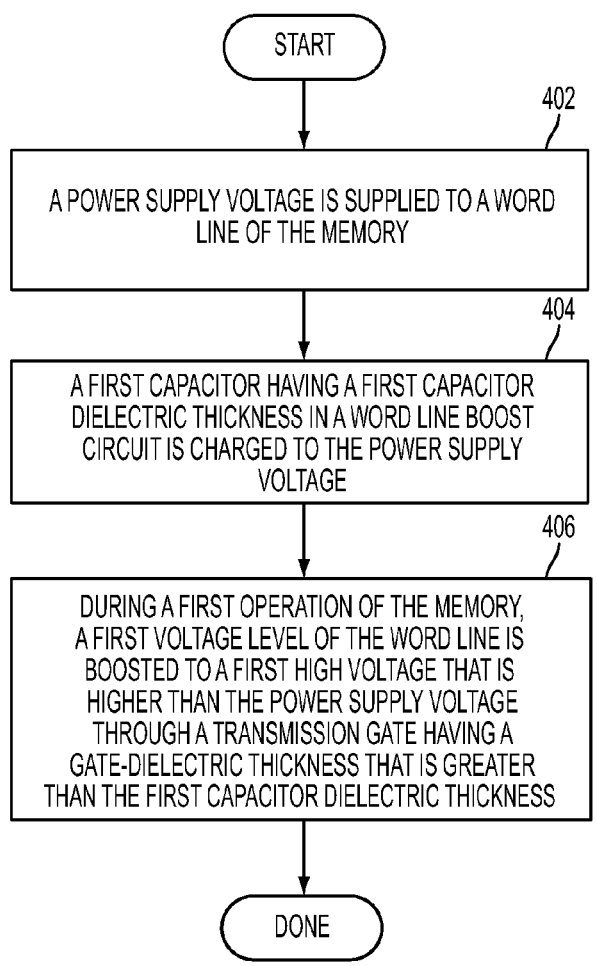
FIG. 4 is a flowchart of a method for the exemplary word line boost circuit for a memory in FIG. 1 according to some embodiments.

FIG. 4 is a flowchart of a method for the exemplary word line boost circuit for a memory in FIG. 1 according to some embodiments. At step 402, a power supply voltage (e.g., VDD=1.8 V) is supplied to a word line of the memory. At step 404, a first capacitor (e.g., Q3) is charged to the power supply voltage level (e.g., VDD). The first capacitor (e.g., Q3) in the word line boost circuit (e.g., 101) has a first capacitor dielectric thickness. At step 406 during a first operation (e.g., a read operation) of the memory, a first voltage level of the word line is boosted through a transmission gate (e.g., comprising devices Q1 and Q2) to a first high voltage (e.g., 2.6 V) that is higher than the power supply voltage (e.g., 1.8 V). The transmission gate has a second gate-dielectric thickness that is greater than the first capacitor dielectric thickness.

In various embodiments, a pulse (e.g., CK2) is supplied for the first capacitor (e.g., Q3). The pulse (e.g., CK2) is delayed. The delayed pulse (e.g., CK2) is supplied to the first capacitor (e.g., Q3). A second capacitor (e.g., C1) is charged to the power supply voltage (e.g., VDD). The second capacitor (e.g., C1) has a second capacitor dielectric thickness greater than the first capacitor dielectric thickness. A pulse (e.g., CK1) is supplied to the second capacitor (e.g., C1). A switch (e.g., SW1) coupled to the word line and the second capacitor (e.g., C1) is opened during the first operation (e.g., a read operation) of the memory.

In various embodiments, a second voltage level of a bulk (e.g., 108) of a PMOS transistor (e.g., Q1) in the transmission gate is boosted to a second high voltage (e.g., 2.6 V) that is higher than the power supply voltage (e.g., 1.8 V) during the first operation, e.g., a read operation, of the memory. The bulk (e.g., 108) is coupled to the second capacitor (e.g., C1).

In various embodiments, a third high voltage (e.g., 13 V) that is higher than the first high voltage (e.g., 2.6 V) is supplied to the word line during a second operation (e.g., an erase operation) of the memory. The first capacitor (e.g., Q3) is isolated from the third high voltage (e.g., 13 V) during the second operation, e.g., an erase operation, of the memory. The isolation of the first capacitor (e.g., Q3) is performed by turning off the transmission gate (e.g., devices Q1 and Q2).

According to some embodiments, a memory includes a word line and a word line boost circuit. The word line boost circuit includes a capacitor having a first capacitor dielectric thickness, and a transmission gate coupled to the word line and the capacitor. The transmission gate has a gate-dielectric thickness that is greater than the first capacitor dielectric thickness. The word line boost circuit is configured to supply a high voltage that is higher than a power supply voltage to the word line during an operation of the memory by utilizing the capacitor.

According to some embodiments, a method for boosting a word line of a memory includes supplying a power supply voltage to a word line of the memory. A capacitor has the first capacitor dielectric thickness in a word line boost circuit. The capacitor is charged to the power supply voltage. The voltage level of the word line is boosted to a high voltage that is higher than the power supply voltage through a transmission gate having a gate-dielectric thickness that is greater than the first capacitor dielectric thickness during an operation of the memory.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A memory, comprising:
    a word line; and
    a word line boost circuit including:
        a first capacitor having a first capacitor dielectric thickness; and
        a transmission gate coupled to the word line and the first capacitor, the transmission gate having a gate-dielectric thickness that is greater than the first capacitor dielectric thickness,
    wherein the word line boost circuit is configured to supply a first high voltage that is higher than a power supply voltage to the word line during a first operation of the memory by utilizing the first capacitor.

2. The memory of claim 1, wherein the word line boost circuit further comprises a pulse generator that supplies a pulse for the first capacitor.

3. The memory of claim 2, wherein the word line boost circuit further comprises a delay buffer coupled to the pulse generator and the first capacitor.

4. The memory of claim 2, wherein the word line boost circuit further comprises a second capacitor coupled to the pulse generator, the second capacitor having a second capacitor dielectric thickness that is greater than the first capacitor dielectric thickness.

5. The memory of claim 4, wherein the word line boost circuit further comprises a switch between the second capacitor and the word line.

6. The memory of claim 4, wherein the second capacitor is coupled to a bulk of a PMOS transistor of the transmission gate.

7. The memory of claim 4, wherein the first capacitor and the second capacitor are arranged to be coupled to ground during a second operation of the memory when a second high voltage that is higher than the first high voltage is supplied to the word line.

8. The memory of claim 1, wherein the memory further comprises a word line bias supply configured to supply a second high voltage that is higher than the first high voltage to the word line during a second operation of the memory.

9. A method for boosting a word line of a memory, comprising:
supplying a power supply voltage to a word line of the memory;
charging a first capacitor having a first capacitor dielectric thickness in a word line boost circuit to the power supply voltage; and
during a first operation of the memory, boosting a first voltage level of the word line to a first high voltage that is higher than the power supply voltage through a transmission gate having a gate-dielectric thickness that is greater than the first capacitor dielectric thickness.

10. The method of claim 9, further comprising supplying a pulse for the first capacitor.

11. The method of claim 10, further comprising:
delaying the pulse; and
supplying the delayed pulse to the first capacitor.

12. The method of claim 9, further comprising charging a second capacitor to the power supply voltage, the second capacitor having a second capacitor dielectric thickness greater than the first capacitor dielectric thickness.

13. The method of claim 12, further comprising supplying a pulse to the second capacitor.

14. The method of claim 13, further comprising during the first operation of the memory boosting a second voltage level of a bulk of a PMOS transistor in the transmission gate to a second high voltage, wherein the bulk is coupled to the second capacitor and the second high voltage is higher than the power supply voltage.

15. The method of claim 13, further comprising during the first operation of the memory, opening a switch coupled to the word line and the second capacitor.

16. The method of claim 9, further comprising during a second operation of the memory, supplying a second high voltage that is higher than the first high voltage to the word line.

17. The method of claim 16, further comprising during the second operation of the memory, isolating the first capacitor from the second high voltage.

18. The method of claim 16, wherein the isolating the first capacitor comprises turning off the transmission gate.

19. A memory, comprising:
a word line; and
a word line boost circuit including:
a first capacitor having a first capacitor dielectric thickness;
a pulse generator that supplies a pulse;
a delay buffer coupled to the pulse generator and the first capacitor;
a second capacitor coupled to the pulse generator, the second capacitor having a second capacitor dielectric thickness that is greater than the first capacitor dielectric thickness;
a switch coupled to the second capacitor and the word line; and
a transmission gate coupled to the word line and the first capacitor, the transmission gate having a gate-dielectric thickness that is greater than the first capacitor dielectric thickness;
wherein the second capacitor is coupled to a bulk of a PMOS transistor of the transmission gate, the switch is configured to be closed during a first operation of the memory, and the word line boost circuit is configured to supply a first high voltage that is higher than a power supply voltage to the word line during the first operation of the memory by utilizing the first capacitor.

20. The memory of claim 19, wherein the memory further comprises a word line bias supply configured to supply a second high voltage that is higher than the first high voltage to the word line during a second operation of the memory.

* * * * *